United States Patent [19]
Johnson et al.

[11] Patent Number: 5,900,663
[45] Date of Patent: May 4, 1999

[54] QUASI-MESH GATE STRUCTURE FOR LATERAL RF MOS DEVICES

[75] Inventors: Joseph Herbert Johnson, Sunnyvale; Pablo Eugenio D'Anna, Los Altos, both of Calif.

[73] Assignee: XEMOD, Inc., Sunnvale, Calif.

[21] Appl. No.: 09/020,256

[22] Filed: Feb. 7, 1998

[51] Int. Cl.[6] .................................................. H01L 29/76
[52] U.S. Cl. .......................... 257/343; 257/341; 257/401
[58] Field of Search ................................. 257/341, 343, 257/401, 339, 162, 327, 382–384, 621; 438/306

[56] References Cited

U.S. PATENT DOCUMENTS 5,155,563  10/1992  Davies et al. .
5,164,802  11/1992  Jones et al. .............................. 257/341
5,304,827   4/1994  Malhi et al. ............................ 257/343
5,528,065   6/1996  Battersby et al. ...................... 257/365

*Primary Examiner*—Tom Thomas
*Assistant Examiner*—Ori Nadav
*Attorney, Agent, or Firm*—Boris G. Tankhilevich

[57] ABSTRACT

A quasi-mesh gate structure for the RF MOS transistor having a conductive plug source-body-backside connection is disclosed. The RF MOS transistor having the quasi-mesh gate structure utilizes significantly shorter feeding gate paths as compared to the long feeding gate paths used in the prior art RF MOS devices. The RF MOS transistor having the quasi-mesh gate structure can utilize the polysilicon gates or silicided gates. This results in simplification of the fabrication process and/or improved performance at high frequencies.

14 Claims, 4 Drawing Sheets

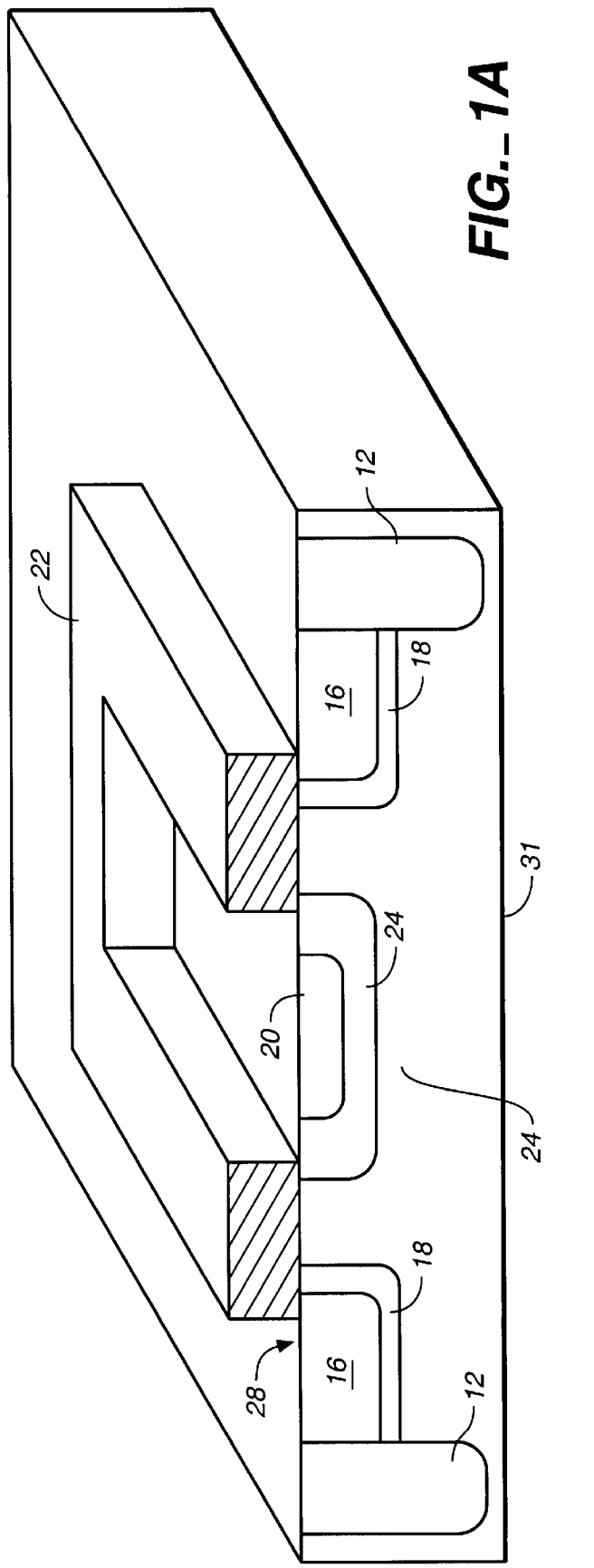

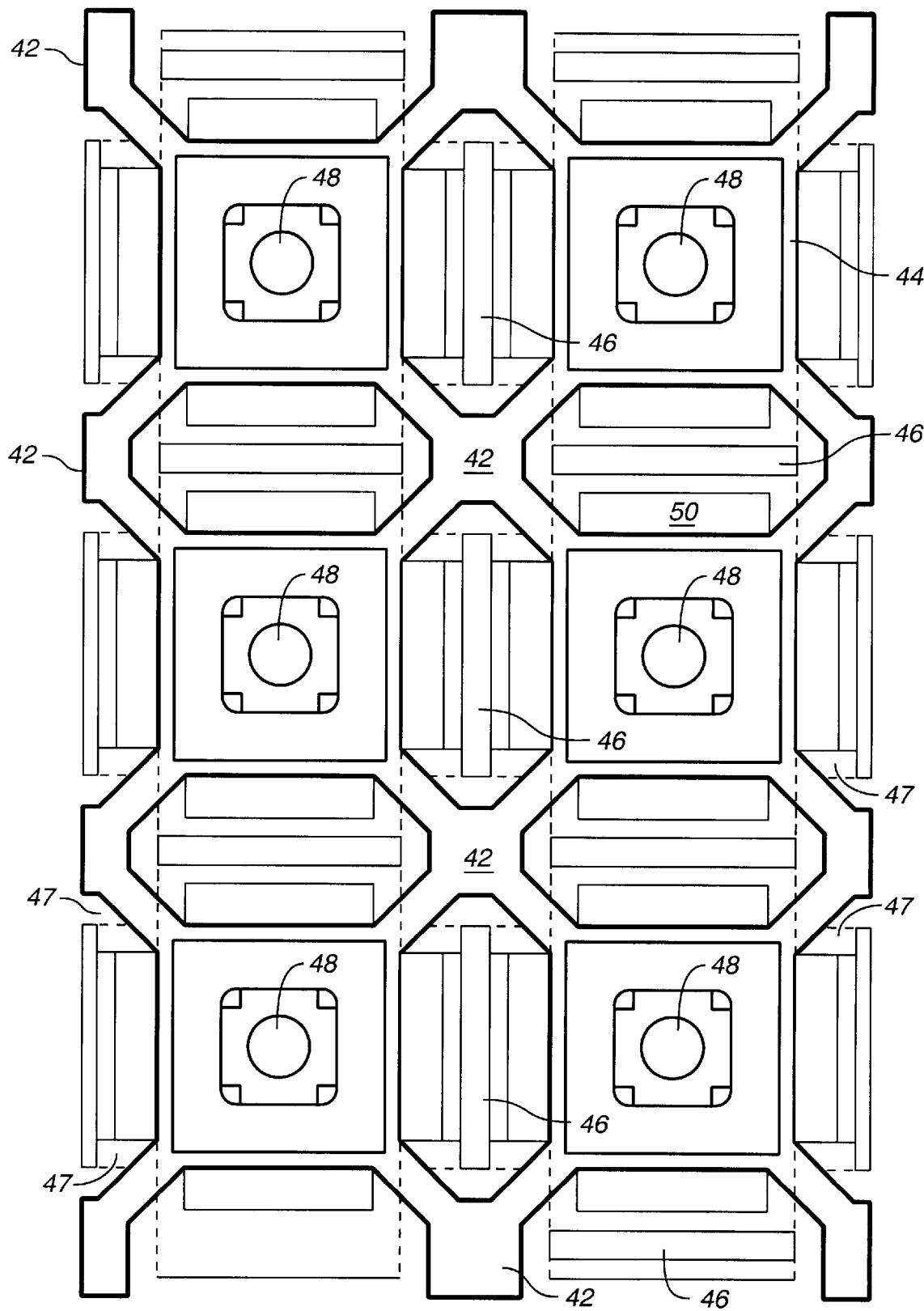
FIG._1B

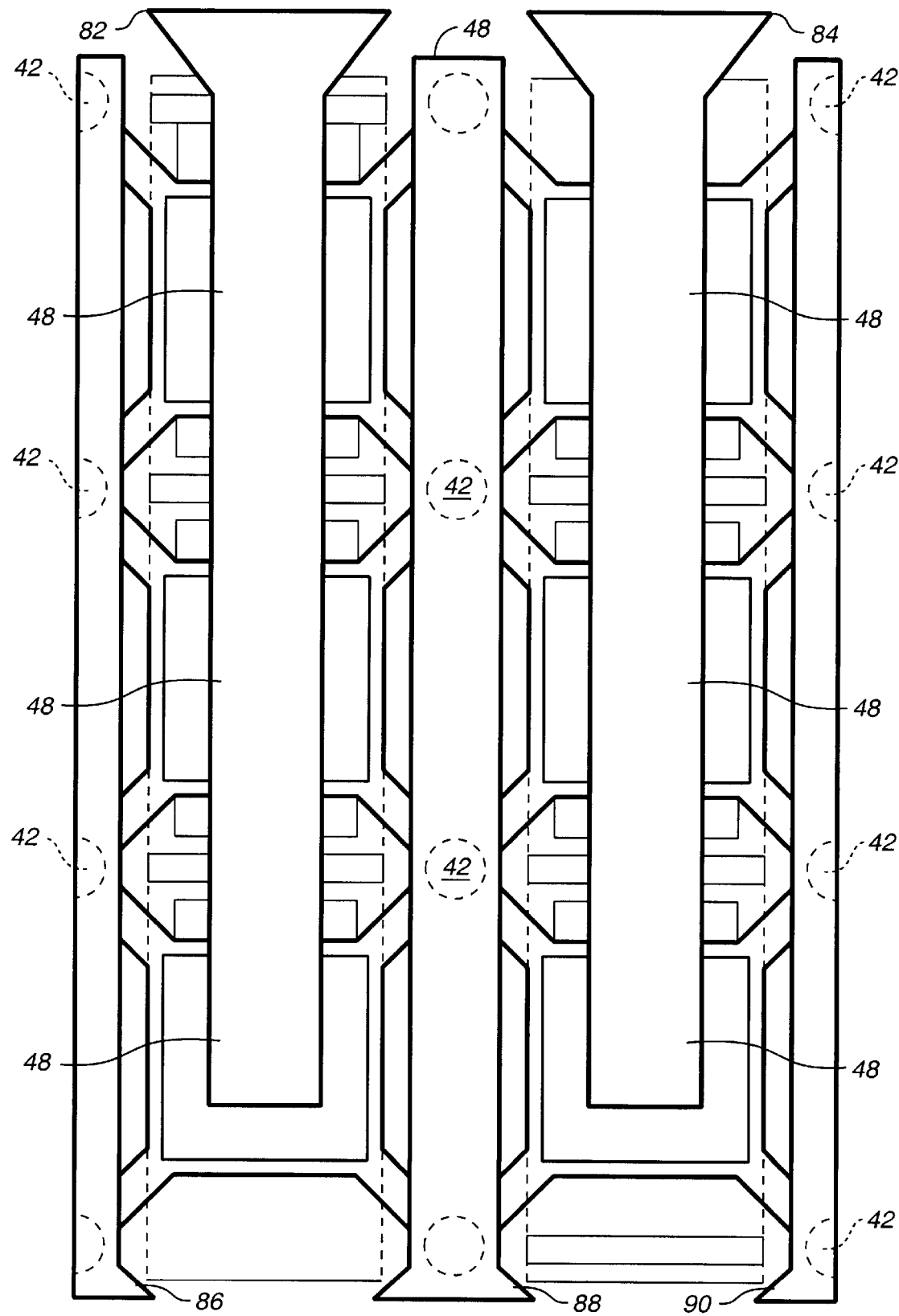
FIG._2

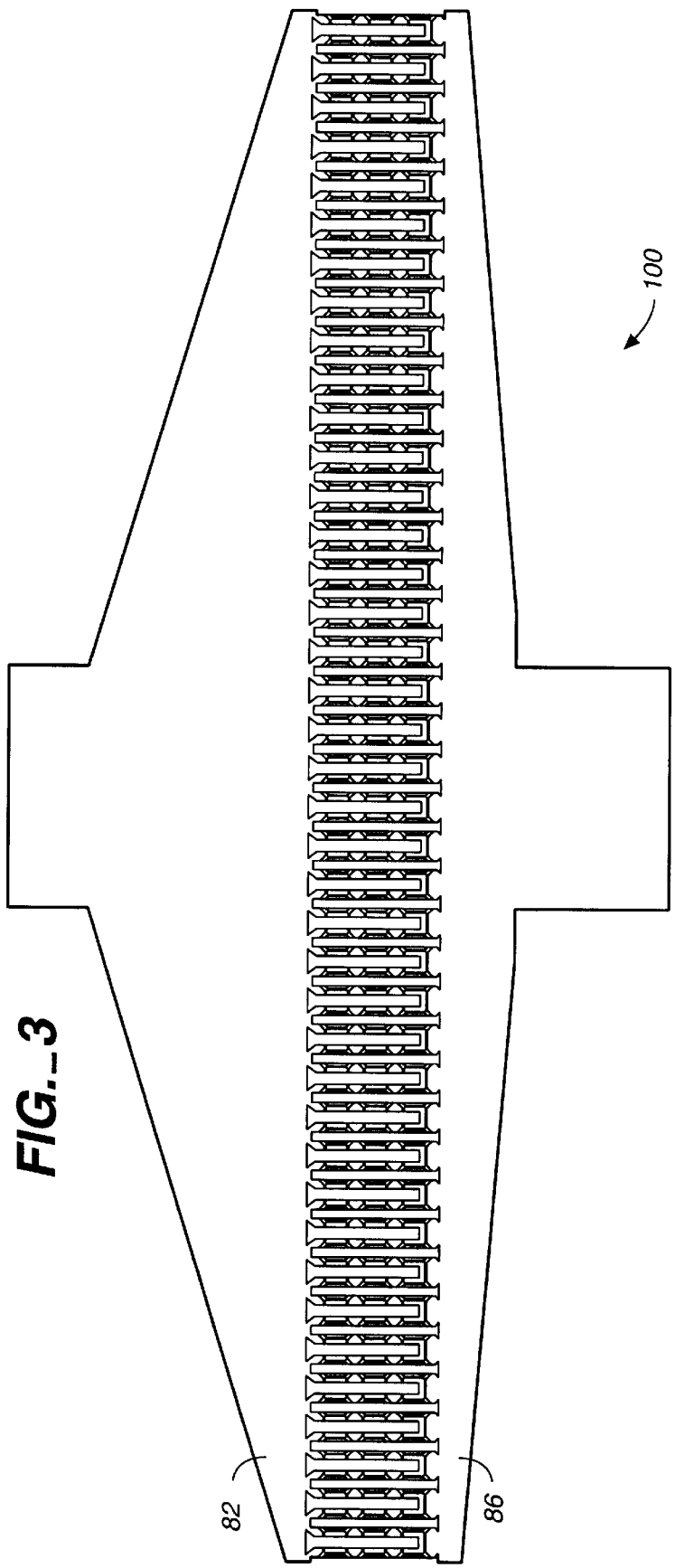
FIG._3

QUASI-MESH GATE STRUCTURE FOR LATERAL RF MOS DEVICES

BACKGROUND

The current patent application incorporates in its entirety the patent application entitled "A SOURCE CONNECTION STRUCTURE FOR LATERAL RF MOS DEVICES" filed on the same day as the current patent application and assigned to the same assignee.

Power high frequency devices have been built using a variety of semiconductor technologies. For a long time the preferred vehicle for their realization has been the NPN bipolar junction transistor (BJT). Its primary advantage was the achievable high intrinsic transconductance ($g_m$) that permitted the fabrication of high power devices utilizing small silicon areas.

As processing technology improved, in the early 1970's a number of MOSFET vertical structures begun to challenge the dominance of the BJT at the lower RF frequencies, trading the cost of the large silicon area, necessary to provide the current capability in MOSFETs, for the cost of simple processing. The advantages that the MOSFET structure provided to the user were: higher power gain, ruggedness (defined as the capacity to withstand transients) and ease of biasing.

In the continuous quest for high frequency operation at high power the MOSFET structure has displaced the BJT since the early 1970's in applications where its performance has been competitive.

Recently, new RF MOS devices from several vendors have been placed on the market. The RF MOS device utilizes the standard lateral MOS device with a diffused via that connects the source and the body to the back side of the chip such that the backside becomes both electrical and thermal ground. The prior art RF MOS device structure also uses a polysilicide gate process as a compromise between the fabrication benefits of the self aligned polysilicon gate and the high frequency performance of the metal gate structure. The prior art RF MOS structure has extended the frequency of operation of MOS devices into the 2 GHz region thus covering two frequency bands of great commercial importance: the cellular and PCS/PCN mobile telephone bands.

In the copending and filed on the same date U.S. patent application entitled "A SOURCE CONNECTION STRUCTURE FOR LATERAL RF MOS DEVICES", the vertical geometry design of the existing RF MOS devices was further improved. This was done by connecting the source and the body of the RF MOS device to the backside of the silicon substrate using a metal plug thus reducing the space needed for that connection. The metal plug design allows a design engineer to utilize more of the RF MOS device active area per unit chip area, to increase the output power per unity chip area, to further decrease the drain-source capacitance ($C_{dS}$), and to increase the bandwidth (BW) of the RF MOS device in the amplifier mode of operation.

In terms of horizontal geometry, the prior art bipolar junction transistor (BJT) used two basic geometries: the interdigitated geometry and the mesh geometry. The interdigitated BJT structure is a set of parallel rows of emitters stripes placed inside a base area. The mesh geometry is similar to the interdigitated but includes connections between emitter stripes.

Traditionally, the RF MOS transistor had the BJT interdigitated horizontal geometry with polysilicon fingers (gate), drain contact in the middle, and the source on both sides. In this geometry, the current moves from the source (from the bottom) to the drain under the gate. The problem with this structure is that the current had to feed a very long and narrow gate. The ratio of the length of the gate $(50-100)\mu$ to the width of the gate $(1\mu)$ was about (50–100). Of course, all portions of a metal gate with the resistivity per square of 0.1 ($\Omega$/square) could be fed very efficiently up to very high frequencies. But, for the prior art polysilicon gate fingers with (50–100 squares) and with the resistivity per square of (20$\Omega$/square), the resistivity was too high 20×100= 2,000$\Omega$, so that different portions of the gate were not fed equally. Depending on the frequency and the resistivity of the material, some portions of the gate were not used at all.

One solution to this problem is to put silicide on the polysilicon gate finger, that is to put metal like tungsten (Tg), titanium (Ti), cobalt (Co), or platinum (Pl) on the polysilicon. If high enough temperature is applied, the metal and the polysilicon mix and form the silicide. The resistivity per square of the silicided gate is significantly decreased comparatively with the polysilicon gate. Indeed, the resistivity per square for the tungsten silicided gate is (2$\Omega$/square), for the titanium silicided gate is 1 ($\Omega$/square), for the cobalt silicided gate is (1–2) ($\Omega$/square), and for the platinum silicided gate is (1–2) ($\Omega$/square).

The silicided gate is adequate for a broad range of frequencies. For instance, the silicided gate fingers in the prior art RF MOS devices could be fed very efficiently at cellular 900 MHz frequencies. However, at higher frequencies, in the range of 2 GHz needed for operation of the personal communication services devices (PCS), the long silicided gate is still not adequate because it can not be fed equally. In addition, at high frequencies about 2 GHz, the long fingers have not only a resistive component, but also a sizable capacitance component, that is, the gate acts as a voltage divider.

What is needed is to further improve the horizontal geometry design of the prior art RF MOS devices at high frequencies by reducing the length of the silicided gate fingers.

SUMMARY

The present invention is unique because it improves the horizontal interdigitated gate geometry design of the prior art RF MOS devices at high frequencies by utilizing the quasi-mesh structure.

One aspect of the present invention is directed to a lateral RF MOS transistor having a quasi-mesh gate structure.

In one embodiment, the quasi-mesh gate structure comprises: (1) a semiconductor material of a first conductivity type having a first dopant concentration and a top surface; (2) a conductive gate overlying and insulated from the top surface of the semiconductor material; (3) a plurality of substantially identical enhanced drain drift regions; (4) a plurality of substantially identical drain regions; (5) a plurality of substantially identical body regions; (6) a plurality of substantially identical source regions; (7) a plurality of substantially identical body contact enhancement regions; (8) a plurality of conductive plug regions, each conductive plug region being used to connect one source and one body regions to the backside of the lateral RF MOS transistor; (9) a layer of an insulator covering the top surface of the semiconductor material, wherein the insulator layer includes a first plurality of openings used to expose the gate and a second plurality of openings used to expose each drain region; (10) a first plurality of metal fingers used to connect each exposed drain region to a first side of the RF MOS transistor; and (11) a second plurality of metal fingers used to connect the exposed gate region to a second side of the RF MOS transistor.

In one embodiment, the first conductivity type is of a P type.

The conductive plug region can comprise: a metal plug region or a silicided plug region. The silicided plug region can comprise: a tungsten silicided plug region, a titanium silicided plug region, a cobalt silicided plug region, or a platinum silicided plug region.

Another aspect of the present invention is directed to a top quasi-mesh gate structure of the lateral RF MOS transistor.

In one embodiment, the top quasi-mesh structure comprises: (1) a conductive gate having a plurality of substantially identical gate sites; (2) a plurality of substantially identical drain regions; (3) a plurality of substantially identical source regions; (4) a plurality of substantially identical conductive plug regions, each conductive plug region being used to connect one source region to the backside of the lateral RF MOS transistor; (5) a first plurality of metal fingers used to connect each drain site to a first side of the RF MOS transistor; and (6) a second plurality of metal fingers used to connect each gate site to a second side of the RF MOS transistor.

At least one substantially identical gate site can approximate: a diamond shape, a circular shape, or a square shape. At least one substantially identical drain site can also approximate: a diamond shape, a circular shape, or a square shape.

BRIEF DESCRIPTION OF THE DRAWINGS

FIG. 1A illustrates a cross-sectional view of an element of the quasi-mesh structure of a lateral RF MOS device of the present invention including a plug connection between a source and a backside.

FIG. 1B depicts a top view of a quasi-mesh structure of the RF MOS device of the present invention showing a plurality of drain regions, a plurality of source regions including a plurality of conductive plugs, and a conductive gate.

FIG. 2 illustrates an actual top view of the quasi-mesh structure of the RF MOS device of the present invention showing how a first plurality of metal fingers connect each drain region and how a second plurality of metal fingers connect each gate contact.

FIG. 3 depicts an actual top view of the complete RF MOS transistor array.

DETAILED DESCRIPTION OF THE PREFERRED EMBODIMENTS

As was stated above, the prior art RF MOS transistor includes the BJT interdigitated horizontal geometry with polysilicon fingers (gate), drain contact in the middle, and the source on both sides. In this geometry, the electron current moves form the source (from the bottom) to the drain passing under the gate. The problem with this structure was that the signal current had to feed a very long and narrow gate. The ratio of the length of the gate $(50-100)\mu$ to the width of the gate $(1\mu)$ was about $(50-100)$. The prior art RF MOS transistor utilizes a plurality of long gate fingers having a size of $(50-100)$ squares and a resistivity per square of 20 ($\Omega$/square). This resistivity ($20\times100=2,000\Omega$) is too high to feed the signal to all portions of the long gate equally because each long finger is connected to a single pick up point.

The RF MOS device of the present invention utilizes a quasi-mesh structure that is disclosed in detail below. The quasi-mesh structure utilizes a plurality of gate areas having dimensions of the order of $(13-18)\mu$ to the side. Thus, instead of the interdigitated structure of the prior art RF MOS transistors, wherein each long gate-finger having size of the order of $(50-100)\mu$ was connected to one gate pick up point, the quasi-mesh structure of the present invention employs a number of relatively short gates $(13-18)\mu$ connected to a plurality of pick up points. (See the detailed description below). Thus, the distance between a typical pick up point and a gate in the quasi-mesh structure of the present invention is up to ten times smaller than the distance between a typical pick up point and a typical long gate in the prior art interdigitated structure.

The silicided long gates employed in the prior art RF MOS transistor can be fed adequately at cellular (900 MHz) frequencies. The RF MOS device of the present invention having a quasi-mesh structure and utilizing relatively short $(13-18)\mu$ polysilicon gates has a resistivity of approximately 200$\Omega$. Thus, all portions of a typical polysilicon gate can be fed equally at cellular (900 MHz) frequencies. Therefore, the RF MOS device having a quasi-mesh gate structure and utilizing relatively short polysilicon gates has the performance of the prior art RF MOS transistors utilizing the long silicided gates at cellular (900 MHz) frequencies. The benefit of using the RF MOS device with relatively short polysilicon gates instead of using the prior art RF MOS transistor with long silicided gates follows from the fact that the polysilicon gates are easier to fabricate than the silicided gates.

At higher frequencies, in the range of 2 GHz, needed for operation of the personal communication services devices (PCS), the prior art RF MOS transistor including long silicided gates is not adequate because the long silicided gates can not be fed equally at these frequencies. In addition, at high frequencies about 2 GHz, the long finger has not only a resistivity component, but also a sizable capacitance component, that is, the gate acts as a voltage divider.

On the other hand, at high frequencies about 2 GHz, the RF MOS device with quasi-mesh gate structure can utilize the silicided gates instead of polysilicon gates. The silicided gates can be fabricated if a metal like tungsten (Tg), titanium (Ti), cobalt (Co), or platinum (Pl) is put on the polysilicon. If high enough temperature is applied, the metal and the polysilicon mix and form the silicide. The resistivity per square of the silicided gate is significantly decreased comparatively with the polysilicon gate. Indeed, the resistivity per square for the tungsten silicided gate is (2$\Omega$/square), for the titanium silicided gate is 1 ($\Omega$/square), for the cobalt silicided gate is (1–2) ($\Omega$/square), and for the platinum silicided gate is (1–2) ($\Omega$/square). The short silicided gates can be fed equally at high frequencies up to 2 GHz. Thus, the RF MOS device with quasi-mesh gate structure utilizing short silicided gates can be used at high frequencies about 2 GHz thus surpassing the performance of the prior art RF MOS transistors utilizing the long silicided gates.

A cross-section of a single RF MOS transistor (10) is depicted in FIG. 1A. The RF MOS device can include an array of single RF MOS transistors of FIG. 1A, as shown in FIG. 3. See discussion below.

As was fully described in the copending patent application "A SOURCE CONNECTION STRUCTURE FOR LATERAL RF MOS DEVICES", the structure (10) of FIG. 1A comprises several layers. The first layer comprises a semiconductor material including an epitaxial layer (24) of a first conductivity type having an epitaxial layer dopant concentration and a top surface (28).

In one embodiment, the epitaxial layer's conductivity type is of a P-type, that is the majority carriers are holes. The dopant concentration of the epitaxial layer is P⁻, wherein (−) indicates that the dopant concentration P⁻ of holes in the epitaxial layer (24) is small comparatively with the hole concentration P in the body region (18). The typical dimensions of the epitaxial layer (24) are (3–10)$\mu$.

In another embodiment of the present invention, the semiconductor material (24) is of a second, N-conductivity type, has a dopant concentration N⁻ and includes a top surface (28). In this embodiment, the majority carriers are electrons.

A conductive gate (2) overlies the top surface (28) of the semiconductor material. The gate (22) is insulated from the semiconductor material by a gate oxide layer (not shown).

In one embodiment, at cellular frequencies, the gate can comprise a polysilicon gate.

In another embodiment, at PCS frequencies, the gate can comprise a silicided gate. (See discussion above). The silicided gate region can comprise: a tungsten silicided gate region, a titanium silicided gate region, a cobalt silicided gate region, or a platinum silicided gate region.

The gate region of a single RF MOS transistor (10), as depicted in FIG. 1A, has the dimensions of (0.5–1.5)$\mu$. The RF MOS device can include an array of single RF MOS transistors of FIG. 1A, as shown in FIG. 3. In the array of single RF MOS transistors, the gate regions form thin finger loop areas having dimensions of the order of (13–15)$\mu$ to the side of the loop.

The region (24) forms an enhanced drain drift region of the RF MOS structure. The region (24) can be formed completely within the semiconductor material (24).

The enhanced drain drift region (24) has N conductivity type (if the epitaxial layer has P conductivity type and vice versa) and has a dopant concentration N. The enhanced drain region increases the drain-to-source breakdown voltage $V_t$ of the structure (10). The enhanced drain region (24) has dimensions (0.1–5.0)$\mu$ laterally, and about (0.2–0.5)$\mu$ vertically.

A drain region (20) is also formed in the semiconductor material (24). The drain region (20) has the N conductivity type (if the epitaxial layer has P conductivity type and vice versa). The drain region (20) has a dopant concentration N⁺ that is greater than the dopant concentration N of the drain enhanced region (24). The drain region (20) contacts the drain enhanced region (24). The typical dimensions of the drain region (174) are (0.5–3.0)$\mu$ horizontally, and (0.1–0.3)$\mu$ vertically.

A body region (18) has P conductivity type (if the epitaxial layer has P conductivity type and vice versa). The body region has a dopant concentration P that is equal or greater than the dopant concentration P⁻ of the epitaxial layer (24). The body region includes a subregion (16) underlying the conductive gate (22). The typical dimensions of the body region (18) are (0.5–1.5)$\mu$ horizontally or vertically.

The body region (18) includes a source contact region (16) being of N conductivity type N (if the epitaxial layer has P conductivity type and vice versa) and having a dopant concentration N⁺. The typical dimensions of the source contact region (166) are (0.5–1.5)$\mu$ horizontally.

A conductive plug region (12) is formed in the source region (27) of the semiconductor material.

In one embodiment, the conductive plug region (12) connects the source (27) and body region (18) of the semiconductor material to a backside (14) of the RF MOS structure.

FIG. 1B illustrates a top view of a quasi-mesh gate structure (40) of the RF MOS device of the present invention showing a plurality of drain regions (48), a plurality of source regions (50) including a plurality of conductive plugs (46), a plurality of separate portions of a conductive gate (44) connected to a plurality of gate pick up points (42), and a plurality of body regions (47).

At least one conductive plug region (46 of FIG. 1B) can comprise a metal plug region or a silicided plug region. The silicided plug region can comprise: a tungsten silicided plug region, a titanium silicided plug region, a cobalt silicided plug region, or a platinum silicided plug region.

Now, we briefly describe a portion of the fabrication process of the quasi-mesh gate structure of the present invention.

The first metallization process allows one to silicide gates and vias.

After the first metallization process is completed, the dielectric, in the preferred embodiment the silicon dioxide ($SiO_2$), is placed on the top of the gate to cover the gate completely.

The access to drain regions and to gate regions can be open by eliminating dielectric at certain area. The access to source regions or plug regions is not open from the top side of the quasi-mesh structure.

By performing the second metallization process, the two sets of metal fingers can be placed in such a way that a first set of fingers connects all drains on one side of the chip, and a second set of fingers connects all gate pick up points on the other side of the chip.

FIG. 2 illustrates an actual top view of the quasi-mesh gate structure (80) of the RF MOS device of the present invention showing how the first set of metal fingers (82, 84) connects each drain region (48) to a first side of the RF MOS device, and how the second set of metal fingers (88, 86, 90) connects each gate pick up point (42) to a second side of the RF MOS transistor.

The top view of the quasi-mesh gate structure, as depicted in FIG. 2, shows that a conductive gate of the whole device includes a plurality of substantially identical gate sites (44).

In one embodiment, each substantially identical gate site can approximate a square shape, as depicted in FIGS. 1B and 2. In another embodiment, each substantially identical gate site can approximate a circular shape. Yet, in one more embodiment, each substantially identical gate site can approximate a diamond shape.

The quasi-mesh gate structure (80) of FIG. 2 also includes a plurality of substantially identical drain regions (48). Each drain region includes a substantially identical drain site.

In one embodiment, each substantially identical drain site can approximate a square shape, as depicted in FIGS. 1B and 2. In another embodiment, each substantially identical drain site can approximate a circular shape. Yet, in one more embodiment, each substantially identical drain site can approximate a diamond shape.

Thus, the quasi-mesh gate structure, as shown in FIG. 2, results in a dense array of sources, gate loops, and drain regions. The quasi-mesh gate structure of the present invention enables the gate loop regions to be smaller as compared with the long gates used in the prior art RF MOS device. Thus, the RF MOS device of the present invention having the quasi-mesh gate structure enables smaller resistivity of the gates and betters feeding of all portions of the gate structure at high frequencies.

The metal fingers connect all the drain and gate contacts at the end and direct the currents to pads where bonding wires, bumps or other packaging means take the signals to the rest of the outside circuit.

An actual top view of the complete transistor array (100) is shown in FIG. 3. The size of the transistor array can be selected to achieve virtually any RF current handling capacity.

The description of the preferred embodiments of this invention is given for purposes of explaining the principles thereof, and is not to be considered as limiting or restricting the invention since many modifications may be made by the exercise of skill in the art without departing from the scope of the invention.

What is claimed is:

1. A lateral RF MOS transistor having a quasi-mesh gate structure comprising:

a semiconductor material of a first conductivity type, said semiconductor material having a first dopant concentration and a top surface;

a conductive gate overlying and insulated from said top surface of said semiconductor material;

a plurality of first regions formed completely within said semiconductor material of said first conductivity type, said first regions being of a second conductivity type and a second dopant concentration to form substantially identical enhanced drain drift regions of said lateral RF MOS transistor, each of said first regions having a first end, wherein said first end of each of said first regions underlies a portion of said conductive gate;

a plurality of second regions formed in said semiconductor material, said second regions being of said second conductivity type and a third dopant concentration greater than said second dopant concentration to form substantially identical drain regions of said lateral RF MOS transistor, wherein each of said second regions contacts a respective one of said first regions, wherein each of said second regions is separated from said conductive gate by a first distance necessary to achieve a first breakdown voltage;

a plurality of third regions formed in said semiconductor material, said third regions being of said first conductivity type and a fourth dopant concentration to form substantially identical body regions of said lateral RF MOS transistor, said fourth dopant concentration being equal or greater than said first dopant concentration, each of said third regions having a first end, wherein said first end of each of said third regions underlies a portion of said conductive gate, any remaining portion of said semiconductor material underlying said gate being of said first conductivity type;

a plurality of fourth regions formed in said semiconductor material, each of said fourth regions being of said second conductivity type and a fifth dopant concentration to form substantially identical source regions of said lateral RF MOS transistor, each of said fourth regions located within a respective one of said third regions, and wherein each of said fourth regions underlies a portion of said gate;

a plurality of fifth regions formed in said semiconductor material, each of said fifth regions being of said first conductivity type and a sixth dopant concentration to form substantially identical body contact enhancement regions of said lateral RF MOS transistor, said sixth dopant concentration being greater than said fourth dopant concentration, each of said fifth regions being located within a respective one of said third regions;

a plurality of conductive plug regions, each said conductive plug region being formed in a respective one of said source regions and said body regions, each said conductive plug region being used to connect one said source region and one said body region of said semiconductor material to a backside of said lateral RF MOS transistor;

a layer of an insulator covering said top surface of said semiconductor material, said insulator layer including a first plurality of openings and a second plurality of openings; said first plurality of openings used to expose said gate; said second plurality of openings used to expose each said drain region;

a first plurality of metal fingers used to connect each said exposed drain region to a first side of said RF MOS transistor; and a second plurality of metal fingers used to connect said exposed gate region to a second side of said RF MOS transistor;

wherein the usage of said plurality of conductive plug regions allows to make a low resistance connection between said plurality of source areas and said backside of a substrate of said lateral RF MOS transistor.

2. The lateral RF MOS transistor of claim 1, wherein said first conductivity type is a P type.

3. The lateral RF MOS transistor of claim 1, wherein at least one said conductive plug region comprises a metal plug region.

4. The lateral RF MOS transistor of claim 1, wherein at least one said conductive plug region comprises a silicided plug region.

5. The lateral RF MOS transistor of claim 4, wherein said at least one silicided plug region comprises a tungsten silicided plug region.

6. The lateral RF MOS transistor of claim 4, wherein said at least one silicided plug region comprises a titanium silicided plug region.

7. The lateral RF MOS transistor of claim 4, wherein said at least one silicided plug region comprises a cobalt silicided plug region.

8. The lateral RF MOS transistor of claim 4, wherein said at least one silicided plug region comprises a platinum silicided plug region.

9. A lateral RF MOS transistor having a top quasi-mesh gate structure comprising:

a conductive gate having a plurality of substantially identical gate sites in said top quasi-mesh gate structure;

a plurality of substantially identical drain regions, each of said drain regions having a substantially identical drain site in said top quasi-mesh gate structure;

a plurality of substantially identical source regions;

a plurality of substantially identical body regions;

wherein each of said drain regions is separated from said conductive gate by a first distance necessary to achieve a first breakdown voltage; and wherein each of said body regions underlies a portion of said conductive gate; and wherein each of said source regions is located within a respective one of said body regions, and wherein each of said source regions underlies a portion of said gate;

a plurality of substantially identical conductive plug regions, each of said conductive plug regions being formed in a respective one of said source regions and in one of said body regions, each of said conductive plug regions being used to connect one said source region and one said body region to a backside of said lateral RF MOS transistor;

a first plurality of metal fingers used to connect each said drain site to a first side of said RF MOS transistor; and a second plurality of metal fingers used to connect each said gate site to a second side of said RF MOS transistor.

10. The lateral RF MOS transistor of claim 9, wherein at least one said substantially identical gate site approximates a diamond shape.

11. The lateral RF MOS transistor of claim 9, wherein at least one said substantially identical gate site approximates a circular shape.

12. The lateral RF MOS transistor of claim 9, wherein at least one said substantially identical drain site approximates a square shape.

13. The lateral RF MOS transistor of claim 9, wherein at least one said substantially identical drain site approximates a diamond shape.

14. The lateral RF MOS transistor of claim 9, wherein at least one said substantially identical drain site approximates a circular shape.

* * * * *